United States Patent
Pelli et al.

(10) Patent No.: US 7,522,463 B2
(45) Date of Patent: Apr. 21, 2009

(54) SENSE AMPLIFIER WITH STAGES TO REDUCE CAPACITANCE MISMATCH IN CURRENT MIRROR LOAD

(75) Inventors: Gabriele Pelli, Mortara (IT); Lorenzo Bedarida, Vimercate (IT); Massimiliano Frulio, Milan (IT); Davide Manfre', Pandino (IT)

(73) Assignee: Atmel Corporation, San Jose, CA (US)

( * ) Notice: Subject to any disclaimer, the term of this patent is extended or adjusted under 35 U.S.C. 154(b) by 20 days.

(21) Appl. No.: 11/652,770

(22) Filed: Jan. 12, 2007

(65) Prior Publication Data

US 2008/0170454 A1    Jul. 17, 2008

(51) Int. Cl.
*G11C 7/00*    (2006.01)
(52) U.S. Cl. .................. 365/205; 365/207; 365/210; 365/189.07
(58) Field of Classification Search ............ 365/185.2, 365/185.21, 207, 208, 210, 205, 189.07
See application file for complete search history.

(56) References Cited

U.S. PATENT DOCUMENTS

| | | | |
|---|---|---|---|
| 4,713,797 A | 12/1987 | Morton et al. | |
| 4,871,933 A * | 10/1989 | Galbraith | 327/53 |
| 6,400,607 B1 * | 6/2002 | Pasotti et al. | 365/185.21 |
| 7,088,626 B2 * | 8/2006 | Mori et al. | 365/189.11 |
| 2003/0026128 A1 | 2/2003 | Michael et al. | |
| 2003/0063496 A1 | 4/2003 | Baglin et al. | |
| 2003/0095431 A1 | 5/2003 | Khalid | |
| 2003/0156458 A1 | 8/2003 | Confalonieri | |
| 2004/0120200 A1 | 6/2004 | Gogl et al. | |
| 2004/0130352 A1 | 7/2004 | Ekkart et al. | |
| 2005/0237810 A1 | 10/2005 | Vali et al. | |
| 2006/0050584 A1 | 3/2006 | Gogl et al. | |
| 2006/0104136 A1 | 5/2006 | Gogl et al. | |
| 2006/0146624 A1 | 7/2006 | Betser et al. | |
| 2006/0158946 A1 | 7/2006 | Taddeo | |

* cited by examiner

*Primary Examiner*—Huan Hoang
(74) *Attorney, Agent, or Firm*—Schwegman, Lundberg & Woessner, P.A.

(57) ABSTRACT

A sense amplifier circuit for reading the state of memory cells. In one aspect of the invention, the sense amplifier circuit includes a first stage receiving a cell current derived from the memory cell and a reference current derived from a reference cell, and a second stage receiving the cell current and the reference current. A comparator, coupled to the first stage and the second stage, provides an output indicative of the state of the memory cell based on a difference of the voltages provided by the first stage and the second stage, where the state indicated by the comparator is substantially unaffected by capacitive current components provided by transient behavior of the first and second stages.

28 Claims, 3 Drawing Sheets

SENSE AMPLIFIER WITH STAGES TO REDUCE CAPACITANCE MISMATCH IN CURRENT MIRROR LOAD

FIELD OF THE INVENTION

The present invention relates to reading data from memory, and more particularly to a read circuitry for memory cells in which a cell current is compared to a reference current.

BACKGROUND OF THE INVENTION

A sense amplifier is electronic circuitry which is typically included in a memory component in an electronic device, and which accomplishes the reading of the state of memory cells in the memory. This reading process depends on how much current a memory cell sinks under well-defined biasing conditions. The task of a sense amplifier is to transform this current information into binary information that is suitable to be used as internal digital memory data. In the simplest case, the binary information consists of two logical levels ("1" or "0"), which respectively correspond to the memory cell states in which the cell sinks or does not sink a current under well-defined biasing conditions.

One way to read the cell state is to compare the cell current ($I_{cell}$) with a reference current ($I_{ref}$), usually provided by another cell, and track the process characteristics of the memory cell. The reference cell usually sinks a current having a value placed between the cell current in the logical state "1" and the cell current in the logical state "0." For example, if the memory cell in the state "0" sinks no current, the reference cell could sink one half of the cell current in the logical state "1." The sense amplifier reads the difference between the cell current and the reference current, transforming it into binary information suitable to be used by the other memory chip circuits. For example, the current difference can be positive or negative if the cell state is "1" or "0," respectively, so that the sense amplifier generates a binary signal "1" or "0," respectively.

FIG. 1 illustrates a conventional scheme for a sense amplifier system 10. The elements 500, 600, 530, and 630 are not parts of the sense amplifier itself, but these elements schematically depict the cell memory array. Memory cell 500 is a cell of which it is wanted to know the state, and reference cell 600 is provided as the reference. These cells typically are linked to the sense amplifier circuitry by bit-lines 530 and 630, respectively. In order to allow the cells 500 and 600 to conduct their currents, the voltages of the gates 510 and 610 and the drains 520 and 620 must be brought to an opportune voltage value. In particular, the drain voltages are set by the sense amplifier circuitry, using the feedback configuration build-up with the inverters 310 and 410. In other embodiments, other methods can be used to ensure the correct polarization of the drain voltages. The inverters ensure that an opportune voltage value (for example, about 1V) is set on the nodes 540 and 640 as well on the nodes 520 and 620 placed at the end of the bit lines 530 and 630, respectively. A pass gate 700, controlled by enable signal 710, keeps the nodes 800 and 900 at the same voltage value only for an initial transient period called the "equalizing phase." During this phase, the transistor 200 sets the node 900 voltage and, via the pass gate 700 with transistor 100, also sets the node 800 voltage. In fact, since the transistor 200 is in a diode configuration, a well-defined relation exists between its gate-to-source voltage and the drain current:

$$I_{ds} = \frac{\mu C_{ox}}{2} \frac{W}{L} (V_{gs} - V_{th})^2 \quad (1)$$

where $I_{ds}$ is the drain-to-source current, $\mu$ is the carrier mobility, $C_{ox}$ is the gate oxide capacitance per unit area, W and L are respectively the width and the length of the transistor, $V_{gs}$ is the gate to source voltage, and $V_{th}$ is the threshold voltage. For a given $I_{ds}$, the node 900 voltage value is determined since its value coincides with $V_{gs}$ of the transistor 200 as appearing in Equation (1).

A first simplified analysis of the circuit is now presented for the "steady state" condition, in which all the currents and voltages are settled. Once this state is reached, the transistors 300 and 400 sink the cell current and the reference current, respectively. The transistors 100 and 200 constitute the well-known mirror configuration, that is, all the current passing through the transistor 200 is transferred to the transistor 100. Once the pass gate 700 is turned off, the transistor 200 supplies the reference cell current through the transistor 400. Transistor 200, in turn, transfers it to the other side of the circuit by the transistor 100. The node 800 receives the reference current from the transistor 100 and the cell current from the transistor 300. Therefore, starting from a voltage fixed by the transistor 200 during the equalization phase, the node 800 evolves as driven by the current difference ($I_{ref} - I_{cell}$), following this simple law:

$$\Delta V_{800} = \frac{(I_{ref} - I_{cell}) \cdot \Delta T}{C_{800}} \quad (2)$$

where $\Delta V_{800}$ is the voltage difference of which the parasitic capacitance of the node 800 (referred to as $C_{800}$) is charged, or discharged, by the current difference ($I_{ref} - I_{cell}$) after the time $\Delta T$. $C_{800}$ is the sum of the parasitic capacitance of the transistors coupled to the node 800 plus the parasitic capacitance of the interconnecting metals of component connections. It is worth noticing that, in Equation (2), $I_{ref}$ and $I_{cell}$ are assumed constant in time because the steady state condition is presumed to have been reached for this simplified analysis. The voltage level of the node 900 accurately represents the reference current because the node's value directly depends on the $I_{ref}$ value according to Equation (1), while the voltage level of the node 800 accurately represents the cell current because node 800 is charged or discharged, with respect to its starting value, depending on the cell current value. If, for simplicity, $C_{800}$ is called $C_{out}$, the equation for $V_{out}$ becomes:

$$V_{out} = \frac{(I_{ref} - I_{cell}) \cdot \Delta T}{C_{out}}. \quad (3)$$

$V_{out}$ has a positive sign if the circuit is sensing a "0," negative if is sensing a "1," and its magnitude grows with time. This voltage difference is suitable to be used as input for the comparator 1000, which amplifies it in order to have a full swing signal (i.e. GND or $V_{dd}$). The amplified form of the signal provides the binary information needed and suitable to be used for the internal binary data exchange; conventionally, the full swing signal at $V_{dd}$ or GND respectively corresponds to the logical level "1" or "0."

The above analysis is for the simple case in which only the steady state currents pass through the transistors. Unfortunately, the steady state condition may take a long time to be reached, especially if high capacitive bit-lines link the cells to the sense amplifier circuitry and the cell current is very low. During a transient period, called "precharging phase" (which begins when the currents from the main path transistors start to charge bitlines and ends once the precharging currents becomes negligible with respect to the cells currents), a current passes through the bit-lines to bring up the drains of the cells to the desired voltage level (about 1 V). This phase must take the shorter possible time; thus, the width of transistors 100, 200, 300, and 400 must be large enough to supply all the required precharging current from $V_{dd}$. At the beginning of the phase this current reaches a peak, proportional to the bit-line capacitance value, and then the current drops to zero and only the steady state current passes through the transistors 300 and 400. Once the pass gate 700 is turned off, the node 800 changes, as depicted by Equation (2), with a speed inversely proportional to the value of $C_{800}$. Since the transistors 100 and 300 may be quite large, $C_{800}$ can also be quite large and the node 800 may not change fast enough to allow the desired reading performance of the system. Moreover, the current difference $(I_{ref}-I_{cell})$ can be very small, driving the node 800 with a very low strength. In conclusion, this simple sense amplifier scheme can be unsuitable to read the data in a fast way, especially in the case in which long bit-lines link the cells to the sense amplifier circuitry and the current difference $(I_{ref}-I_{cell})$ is very small.

Another approach for a sense amplifier system 20 is shown in FIG. 2. A folded stage is added to the system of FIG. 1 to improve the speed with which the output node evolves after the equalizing phase. The transistors 100 and 110, and transistors 200 and 210, are in a mirror configuration, in which the current passing through the transistors 100 and 200 is transferred to the folded stage by the transistors 110 and 210, respectively. During the equalizing phase, the transistor 220 sets the node 910 voltage value according to Equation (1) and, via the pass gate 700, together with transistor 120, also sets the node 810 voltage. Once the steady state is reached, the transistors 210 and 110 respectively supply the reference and the cell currents to the folded stage. When the pass gate 700 is turned off, the node 810 receives the cell current via the transistor 110 and, since the transistors 220 and 120 are in a mirror configuration, receives the reference current via the transistor 120. The node 810 thus evolves driven by the current difference $(I_{cell}-I_{ref})$ as depicted by the following equation:

$$\Delta V_{810} = \frac{(I_{cell} - I_{ref}) \cdot \Delta T}{C_{810}} \quad (4)$$

The evolution speed of the node 810 depends on the value of its capacitance $C_{810}$. Equation (4) is similar to Equation (2) that depicts the behavior of the scheme in FIG. 1; therefore, to obtain an improvement with respect to the previous scheme, $C_{810}$ must be quite smaller than $C_{800}$ appearing in Equation (2). Disregarding the interconnecting metals, the main component of $C_{810}$ is due to the parasitic capacitance of the transistors 110 and 120 coupled with the node 810. The smaller are these transistors, the less capacitive is the node. It is not convenient to reduce the size of the transistor 110 too much because it transfers the cell current in the folded stage: if, for example, 110 were n times smaller than 100, the current transferred in the folded stage would be n times smaller, since 110 and 110 are two mirror connected transistors. This is not advisable since the $I_{cell}$ value could be very small. Instead, it is possible to provide a smaller transistor 120 because it does not have to supply the precharging current as supplied by the transistors in the main circuit path. The node 810 then can be much lower in capacitance than node 800 and, when pass gate 700 is turned off, node 810 can evolve faster than the node 800 of the circuit in FIG. 1. If, for simplicity, $C_{810}$ is called $C_{f,out}$, the equation for $V_{out}$ becomes:

$$V_{out} = \frac{(I_{cell} - I_{ref}) \cdot \Delta T}{C_{f,out}} \quad (5)$$

where $C_{f,out}$ is much less than $C_{out}$ appearing in Equation (3). $V_{out}$ has a positive sign if the circuit senses a "1", negative if it senses a "0."

However, the scheme of FIG. 2 has other issues involving the transient behavior of the folded stage itself. During the bit-line precharging phase, the transistors 100 and 200 supply, to the transistors 110 and 210 respectively, the cell and the reference currents ($I_{cell}$ and $I_{ref}$), plus the corresponding bit-line precharging current or, in a more general case, any other transient currents. Even once the pass gate 700 is turned off, the global current coming from the cell and the reference sides of the main circuit can vary in time due to all the above mentioned transient currents. As a consequence, the transistor 220 must continuously adapt its biasing conditions to lead the supplied current, transferring the supplied current to the mirror connected transistor 120. Its gate-to-source voltage must adapt the current injected from the transistor 210 according to Equation (1). Therefore, the parasitic capacitance of the node 910, called $C_{910}$, must be charged or discharged in order to reach the correct biasing condition. This generates a spurious current component, called $I_{C910}$, relative to the charge transfer on the node 910. Since the transistors 220 and 120 are in a mirror configuration, the current $I_{C910}$ is supplied to the node 810 which evolves as it is driven also by this current component. Calling the global currents supplied respectively from the cell and references sides of the main circuit $I_{cell,side}$ ($I_{cell}$ plus any transient currents) and $I_{ref,side}$ ($I_{ref}$ plus any transient currents), the equation for the node 810 becomes:

$$\Delta V_{810} = \frac{1}{C_{810}} \int [I_{cell,side}(t) - I_{ref,side}(t) - I_{C910}(t)] dt \quad (6)$$

It is worth noticing that the integral form in Equation (6) is needed because all the terms in the equation are varying in time (neglecting, for sake of simplicity, the fact that the capacitance $C_{810}$ also varies in time due to the different biasing conditions of the transistors 110 and 120). It should also be pointed out that the exact behavior of any transient currents coming from the main circuit (including transistors 100 or 200), and their repercussion on the reading performance, is out of the scope of this analysis. Starting from the above equation, is possible to focus the analysis on the folded circuit behavior under the influence of the capacitive current component $I_{C910}$. As shown by Equation (6), the latter term is the only current component, depending on the folded stage itself, that can cause an incorrect data read. This current is generated by some transient behavior and then it diminishes to zero at the steady state. This spurious current component can destroy the correct data information acquired from the cell. In the analysis below, the steady state behavior of the circuit (depicted by Equation (4) and set forth as the target behavior) is compared with the behavior depicted by Equation (6).

Depending on the charging or discharging of the node 910, two cases can be analyzed. However, for sake of simplicity and without loss of generality, only the case in which the node 910 is discharging is here analyzed. The extra current required to perform the discharge is supplied by the transistor 220 and then transferred to the node 810 by the mirror connected transistor 120. As a result, the term $I_{c910}$ in Equation (6) is positive, having the effect of discharging the node 810. Reading a "0" ($I_{cell} < I_{ref}$), the circuit behavior at the steady state would be to discharge the node 810, as depicted by Equation 4. In Equation (6), it is shown that the current $I_{c910}$ helps to discharge this node. Therefore, this current does not cause any dangerous effect reading a "0," or rather the read operation receives advantage from this spurious current. On the contrary, reading a "1" ($I_{cell} > I_{ref}$), the steady state behavior (still described by Equation (4)) is to charge the node 810, driven by the positive current difference ($I_{cell} - I_{ref}$). Instead of this, as shown by Equation (6), the node 810 could be discharged by the current $I_{c910}$; this occurs if this current's value is not negligible with respect to the current difference ($I_{cell} - I_{ref}$). As a consequence, the term $I_{c910}$ can change the correct behavior of the circuit: while $I_{c910}$ is greater than the difference ($I_{cell} - I_{ref}$), the node 810 is initially discharged and, only once the node 910 is about to reach its steady state value (that is $I_{C910} < (I_{cell} - I_{ref})$), can the node 810 charge correctly start to rise. Therefore, when reading a "1," the $V_{out}$ signal may be incorrect at the beginning of the transient behavior and indicate a "0" state, and become correct only once the spurious current is almost faded out.

Thus, the issue of spurious current becomes important especially when a sense amplifier is designed to read a very low current difference between the cell and the reference currents. In fact, in this case, the capacitive current $I_{c910}$ may not be negligible with respect to this difference, causing incorrect data acquisition until it reaches almost a zero value. In particular, the issue involves the case in which the cell current absolute value is very small; as a direct consequence, the reference current will also be very small, and so their difference will be very small.

One way to avoid the incorrect reading of the cell state is to wait until the spurious capacitive current reaches zero value or almost a zero value. However, the time required to wait for this effect can be too much with regard to the desired reading performance of many systems.

Accordingly, a sense amplifier circuit that can reduce or cancel the dangerous effects of spurious capacitive current on reading the state of memory cells, even when such current is not yet negligible or zero, would be desirable in many applications.

SUMMARY OF THE INVENTION

The invention of the present application relates to read circuitry for reading the state of memory cells, where a cell current is compared to a reference current. In one aspect of the invention, a sense amplifier circuit for reading a state of a memory cell includes a first stage receiving a cell current derived from the memory cell and a reference current derived from a reference cell, and a second stage receiving the cell current and the reference current. A comparator, coupled to the first stage and the second stage, provides an output indicative of the state of the memory cell based on a difference of the voltages provided by the first stage and the second stage, where the state indicated by the comparator is substantially unaffected by capacitive current components provided by transient behavior of the first and second stages.

In another aspect of the invention, a circuit for reading memory includes a memory cell having a state, a reference cell, and a main circuit coupled to the memory cell and the reference cell, and providing a cell current derived from the memory cell and a reference current derived from the reference cell. A sense amplifier circuit is coupled to the main circuit and provides an output indicative of the state of the memory cell, where the state indicated by the comparator is substantially unaffected by capacitive current components provided by transient behavior of circuitry of the sense amplifier circuit.

In another aspect of the invention, a method for reading a state of a memory cell using a sense amplifier circuit, the method comprising providing a first stage receiving a cell current derived from the memory cell and a reference current derived from a reference cell, and providing a second stage receiving the cell current and the reference current. An output from a comparator is provided, the output indicative of the state of the memory cell based on a difference of the voltages provided by the first stage and the second stage. The state indicated by the comparator is substantially unaffected by capacitive current components provided by transient behavior of the first and second stages.

The present invention provides a sense amplifier circuit for reading memory and which allows fast and accurate reading of the states of a memory cell even during periods of transient and spurious current effect on the circuit, by canceling such current effects on the circuit even while the transient/spurious current is not yet negligible or zero.

DETAILED DESCRIPTION

The present invention relates to reading data from memory, and more particularly to a read circuitry for memory cells in which a cell current is compared to a reference current. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular circuits provided in particular implementations. However, one of ordinary skill in the art will readily recognize that this circuit will operate effectively in other implementations and applications.

To more particularly describe the features of the present invention, please refer to FIG. 3 in conjunction with the discussion below.

Figure 3:
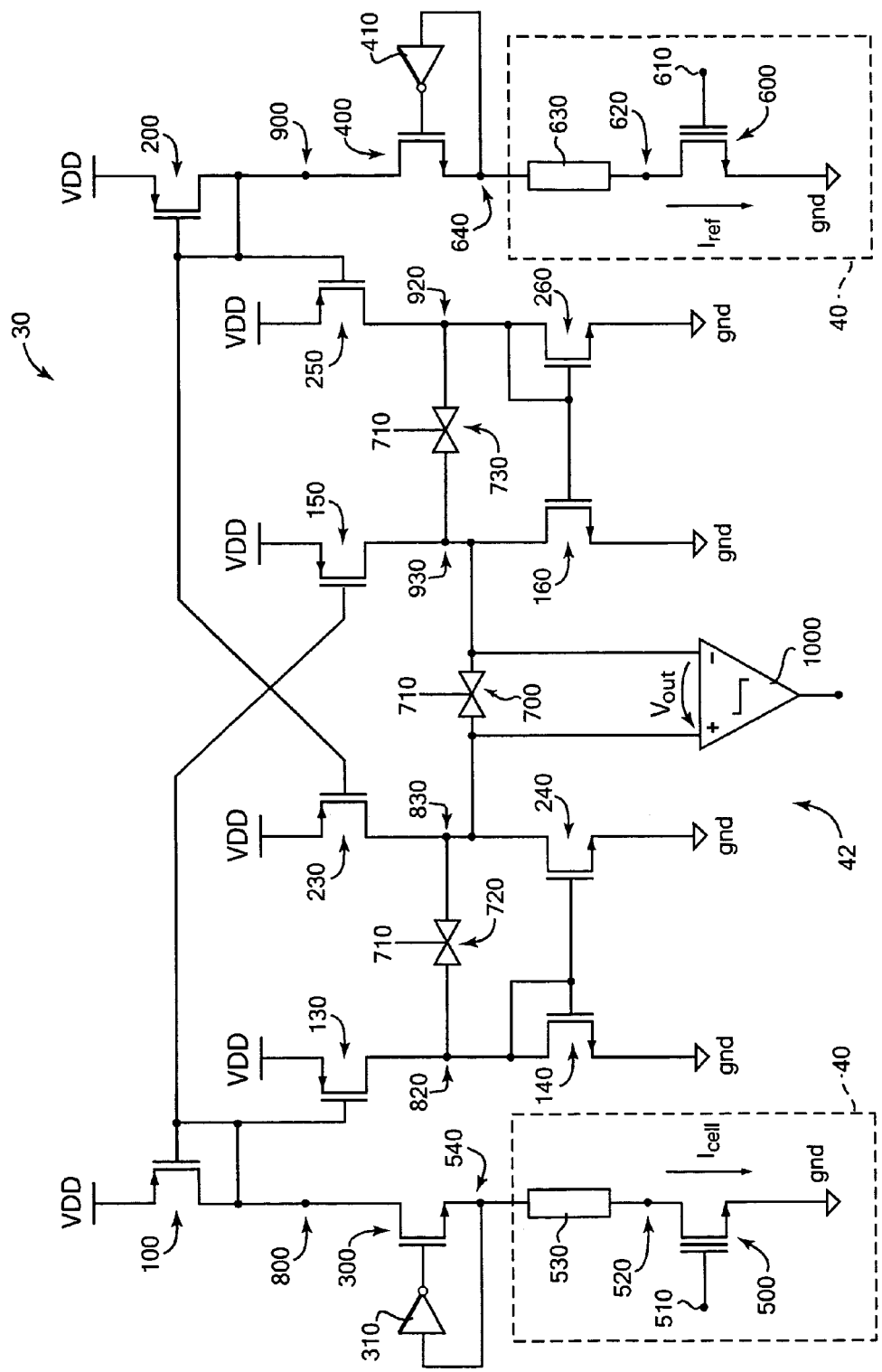
FIG. 3 is a schematic diagram of a sense amplifier circuit of the present invention.

FIG. 3 is a schematic view of a sense amplifier system 30 of the present invention. The sense amplifier system is included in a circuit architecture for reading memory, such as a non-volatile memory; in particular, a cell current is compared to a reference current to read the state of memory cells. The present invention describes a scheme for a sense amplifier which avoids the issues related to a capacitive current component in the folded stage of the prior art implementation. The described transistors are p-channel or n-channel as shown in the example of FIG. 3.

Sense amplifier system 30 includes a cell memory array 40 and a sense amplifier circuit 42. The cell memory array 40 includes a memory cell 500 and a reference cell 600. The memory cell 500 stores information desired to be read by the sense amplifier circuit 42. The drain 520 of memory cell 500 is coupled to the sense amplifier circuit 42 by a bit-line 530. Similarly, the drain 620 of reference cell 600 is coupled to the sense amplifier circuit by a bit-line 630. So that the cells 500 and 600 conduct their currents, the voltages of the gates 510 and 610 and the drains 520 and 620 must be brought to an opportune voltage value. In particular, the drain voltages are set by the sense amplifier circuitry 42, using a feedback configuration build-up with inverters 310 and 410. In alternate embodiments, other methods can be used to ensure the correct polarization of the drain voltages. A transistor 300 has a source coupled to the bit-line 530 at a node 540 and inverter 310 is coupled to its gate. Similarly, transistor 400 has a source coupled to the bit-line 630 at a node 640 and inverter 410 is coupled to its gate. The inverters 310 and 410 ensure that an opportune voltage value (for example, about 1 V) is set on the nodes 540 and 640 as well on the nodes 520 and 620 placed at the end of the bit lines 530 and 630, respectively.

A transistor 100 has a drain connected to the drain of transistor 300 and its source connected to Vdd. Similarly, a transistor 200 has a drain connected to the drain of transistor 400 and its source connected to Vdd. Herein, a "main circuit" of the sense amplifier circuit 42 includes the components on the cell side, from transistor 100 to transistor 300, as well as the components on the reference side, from transistor 200 to transistor 400.

The sense amplifier circuit 42 has two parallel folded stages, where the stages are similar to each other. Transistors 100 and 200 are used to provide the current to the stages. Transistor 100 is in a mirror configuration with transistors 130 and 150, such that the gate of transistor 100 is connected to the gates of transistors 130 and 150. Transistor 130 is part of a first folded stage (or "left stage" in the configuration example of FIG. 3), while transistor 150 is part of a second folded stage (or "right stage" in the configuration example of FIG. 3). Similarly, transistor 200 is in a mirror configuration with transistors 230 and 250, such that the gate of transistor 200 is connected to the gates of transistors 230 and 250. Transistors 230 is part of the first stage, while transistor 250 is part of a second folded stage. The cell current is transferred to both the folded stages by the transistors 130 and 150, while, the reference current is transferred to both the folded stages by the transistors 230 and 250. (The left and right stages can also be considered to be parts of an overall single folded stage.)

In the left stage, the drain of transistor 130 is coupled to the drain of a transistor 140 that is connected in a diode configuration. The gate of transistor 140 is coupled to the gate of transistor 240, and the drain of transistor 240 is coupled to the drain of transistor 230. A pass gate 720 (with a select line 710) is coupled between the nodes 820 and 830, which are provided between the transistors 130 and 140, and between the transistors 230 and 240, respectively. The sources of transistors 130 and 230 are coupled to V$_{dd}$, while the sources of transistors 140 and 240 are coupled to ground.

Similarly, in the right stage of the circuit, the drain of transistor 250 is coupled to the drain of a transistor 260 that is connected in a diode configuration. The gate of transistor 260 is coupled to the gate of transistor 160, and the drain of transistor 160 is coupled to the drain of transistor 150. A pass gate 730 (with select line 710) is coupled between the nodes 930 and 920, which are provided between the transistors 150 and 160, and between the transistors 250 and 260, respectively. The sources of transistors 150 and 250 are coupled to V$_{dd}$, while the sources of transistors 160 and 260 are coupled to ground.

A pass gate 700 (with select line 710) is coupled between the nodes 830 and 930. A comparator 1000 has its inputs coupled on either side of the pass gate 700, i.e. at nodes 830 and 930. The output of the comparator 1000 provides a full swing signal used for providing digital information in the form of a "1" or "0." For example, the pass gate can include a complementary pair of transistors connected by complementary inputs, e.g., one n-channel transistor with its gate as the enable signal 710 and with its drain coupled to node 830 and its source coupled to node 930, and a p-channel transistor with its gate as the complementary signal of the enable signal 710 and with its drain coupled to node 830 and its source coupled to node 930.

In alternate embodiments, other types of transistors can be used in the circuit. For example, PNP transistors can be used instead of PMOS and NPN instead of NMOS. In other embodiments, n-channel transistors can be used for p-channel transistors, and vice-versa, with appropriate modifications to the circuit connections.

In FIG. 3, a folded scheme is doubled into two parallel stages. The right folded stage of the circuit (transistors 150, 160, 250 and 260) is equivalent to folded stage mirror configuration shown in FIG. 2. Therefore, its transient behavior is still depicted by Equation (6) and it suffers from the same issues described for the scheme of FIG. 2. Taking Equation (6) and substituting the correct currents and capacitance, the equation for node 930 becomes:

$$\Delta V_{930} = \frac{1}{C_{930}} \int [I_{cell,side}(t) - I_{ref,side}(t) - I_{C920}(t)]dt \qquad (7)$$

Supposing the node 920 is discharging during a transient period, the right stage of the circuit of FIG. 3 takes advantage from the spurious current $I_{C920}$ when reading a "0" state from the memory cell 500. To correctly read a "1" state from the memory cell, the capacitive current component $I_{C920}$ should be negligible with respect to the difference ($I_{cell}-I_{ref}$).

The parallel left folded stage of the circuit is identical to the right stage, except that the connection from the main circuit is swapped, i.e., provided on the opposite "side" of the stage. For example, the diode-connected transistor (transistor 140 in the left stage) receives the current from the memory cell side of the main circuit, while the diode-connected transistor 260 in the right stage receives the current from the reference side of the main circuit. The equation for the output node 830 can be obtained from the Equation (6) when substituting the correct terms, leading to the following equation:

$$\Delta V_{830} = \frac{1}{C_{830}} \int [I_{ref,side}(t) - I_{cell,side}(t) - I_{C820}(t)]dt \qquad (8)$$

Figure 1:
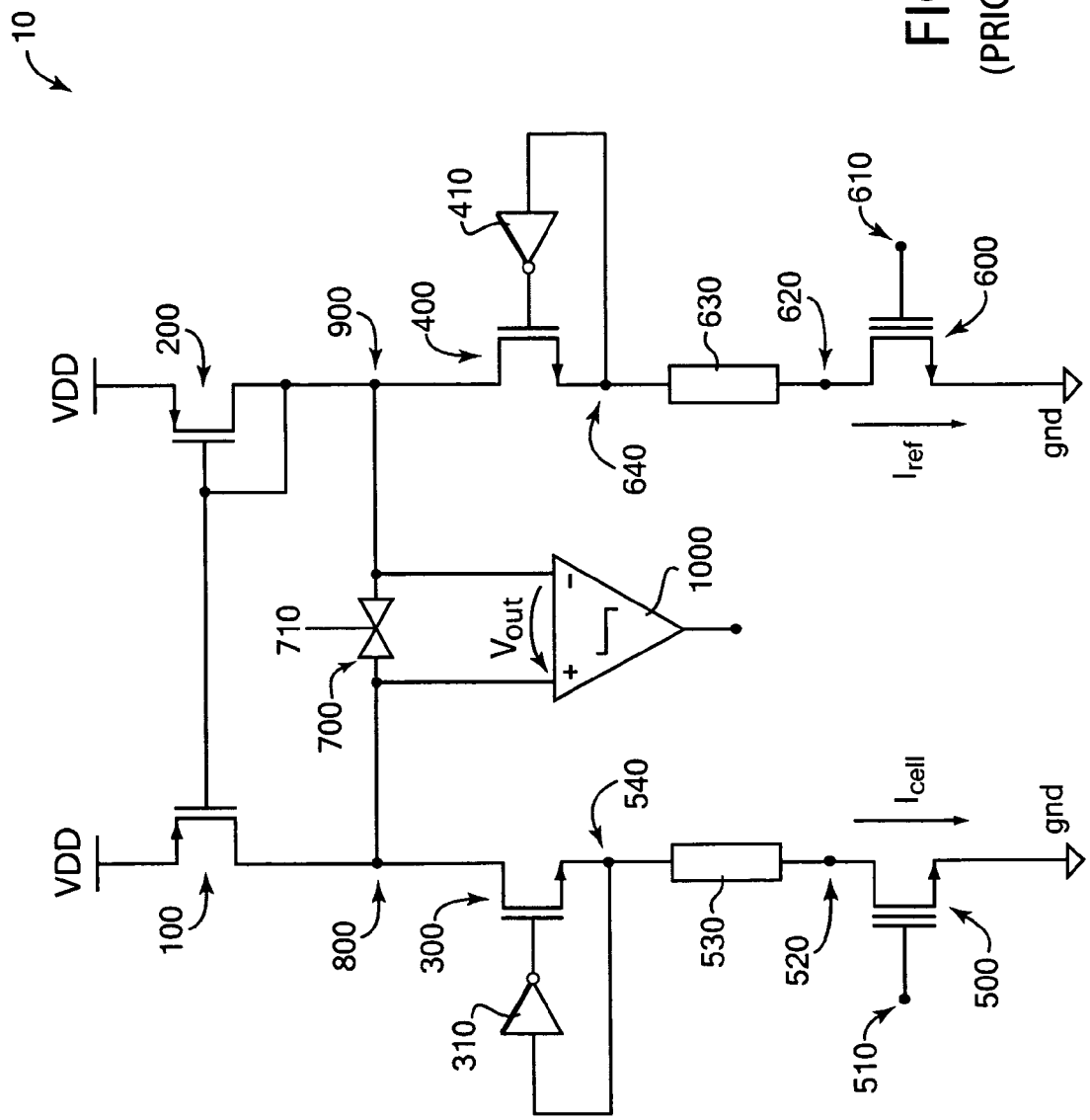
FIG. 1 is a schematic diagram of a sense amplifier circuit of the prior art.
Figure 2:
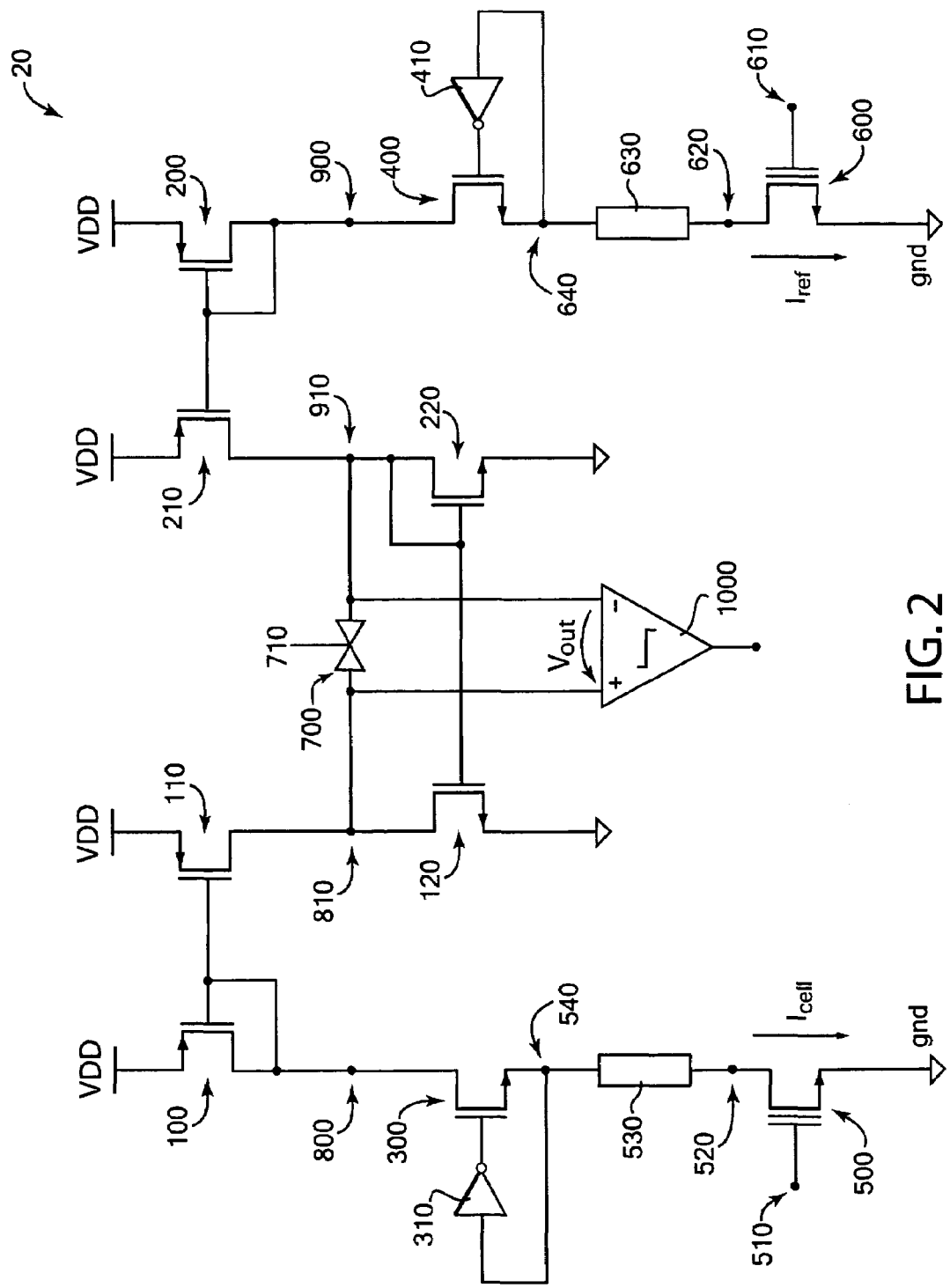
FIG. 2 is a schematic diagram of another embodiment of a prior art sense amplifier circuit.

Similar to the analysis for the circuit in FIG. 2, the behavior of the left part of the folded circuit during its transient period can be analyzed. This analysis is provided only in the case in which the node 820 is discharging, when the capacitive component $I_{C820}$ is positive, for the sake of simplicity. Reading a "1" state ($I_{cell}>I_{ref}$), the current $I_{C820}$ has the same sign as the cell current, thus helping to discharge the node 830 until it is not negligible with respect to the current difference ($I_{ref}-I_{cell}$). Initially the node 830 can be discharged; after discharge, it can be correctly charged by the current difference ($I_{ref}-I_{cell}$). Similar to the explanation for the circuit of FIG. 2, the $V_{out}$ signal sign can be incorrect at the beginning of the transient behavior of the left folded stage, becoming correct only once the capacitive current component $I_{C810}$ is smaller than the current difference ($I_{ref}-I_{cell}$).

It is worth noticing that the two parallel stages of the folded circuitry have opposite behavior: for example, the left stage senses a "1" without any problems, while the right stage reads a "0" without problems. The circuit of the present invention merges together the two folded stages to exploit their opposite behavior. Doing this, the entire circuit functionality takes the best performance from the two stages, canceling their defects. This result is shown by examining the equation for $V_{out}$:

$$V_{out} = \frac{1}{C_{830}} \int [I_{ref,side}(t) - I_{cell,side}(t) - I_{C820}(t)]dt - \frac{1}{C_{930}} \int [I_{cell,side}(t) - I_{ref,side}(t) - I_{C920}(t)]dt \quad (9)$$

In this equation the two terms $I_{C820}$ and $I_{C920}$ represent the potential disturbances for the reading operation. If the two terms $I_{C820}$ and $I_{C920}$ and the two parasitic capacitance values $C_{830}$ and $C_{930}$ had the same value, the two spurious current components would cancel themselves. It is not difficult to achieve this goal by the layout design of the present invention, since the two capacitive current components only depend on the parasitics capacitance value coupled with the nodes 820 and 920. If the transistors in the left and right stages have the same (or substantially the same) physical dimensions, and the circuit layout is implemented so that the interconnecting metals involve the same (or substantially the same) parasitic capacitance, the two spurious currents $I_{C820}$ and $I_{C920}$ will be the same in value (or substantially the same), as will the parasitics capacitances $C_{820}$ and $C_{920}$. Calling $C_{830}=C_{930}=C_{out}$, the equation for $V_{out}$ thus becomes:

$$V_{out} = \frac{2}{C_{out}} \int \{I_{ref,side}(t) - I_{cell,side}(t)]dt \quad (10)$$

Equation (10) shows that only the cell and the reference side currents remain to determine the $V_{out}$ voltage value and sign. As a result, the output voltage no longer depends on the capacitive currents generated by the diode-connected transistors' transient behavior in the folded stages. For a correct and accurate read operation, it is not necessary to wait for this component to fade almost to zero. Instead, it is possible to perform an accurate read operation even during the folded stage transient phase. This allows the circuit to perform a read operation in a very fast manner in comparison to the time required by the prior art schemes. Moreover, as a consequence of the circuit architecture, output signal is doubled with respect to the previous schemes. Therefore, the same voltage difference occurs earlier at the comparator inputs, which also allows a faster reading time than prior art implementations.

The invention allows fast and accurate reading of states of a memory cell even during periods of transient and spurious current effect on the circuit, by canceling such current effects on the circuit even while the transient/spurious current is not yet negligible or zero.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A circuit, comprising:
   a first stage including a first portion of a first mirror configuration with a first node for receiving a cell current derived from a memory cell, a first portion of a second mirror configuration with a first output node for receiving a reference current derived from a reference cell, and a first pass gate coupled between the first node and the first output node;
   a second stage including a second portion of the second mirror configuration with a second node for receiving the reference current, a second portion of the first mirror configuration with a second output node for receiving the cell current, and a second pass gate coupled between the second node and the second output node; and
   a comparator including comparator input nodes coupled to the first and second output nodes for providing an output indicative of a state of the memory cell based on a first voltage at the first output node and a second voltage at the second output node.

2. The circuit of claim 1 wherein a first capacitive current component associated with the first output node has a value substantially equal to a value of a second capacitive current component associated with the second output node.

3. The circuit of claim 2 wherein the first capacitive current component value is dependent on a value of a parasitic capacitance of the first output node, and the second capacitive current component value is dependent on a value of a parasitic capacitance of the second output node.

4. The circuit of claim 1 wherein components of the second stage are substantially identical to components of the first stage.

5. The circuit of claim 1 wherein the first pass gate includes a source coupled to the first node and a drain coupled to the first output node.

6. The circuit of claim 1 wherein the second pass gate includes a source coupled to the second node and a drain coupled to the second output node.

7. The circuit of claim 1 wherein the first portion of the first mirror configuration includes a first diode-connected transistor configured to receive the cell current, and the second portion of the second mirror configuration includes a second diode-connected transistor configured to receive the reference current.

8. The circuit of claim 1 wherein the first and second portions of the first mirror configuration include a pair of transistors arranged in a current mirror to provide the cell current, and the first and second portions of the second mirror configuration include a pair of transistors arranged in a current mirror to provide the reference current.

9. The circuit of claim 1 wherein transistors in the first stage and transistors in the second stage have substantially the same physical dimensions.

10. The circuit of claim 1 wherein a parasitic capacitance of the first node and a parasitic capacitance of the second node are substantially the same, and wherein a parasitic capacitance of the first output node and a parasitic capacitance of the second output node are substantially the same.

11. A system, comprising:
a memory cell;
a reference cell; and
a circuit configured to provide an output indicative of a state of the memory cell, the circuit including:
a first mirror configuration to provide a cell current derived from the memory cell to a first node and a first output node;
a second mirror configuration to provide a reference current derived from the reference cell to a second node and a second output node;
a first pass gate including a source coupled to the first node and a drain coupled to the second output node; and
a second pass gate including a source coupled to the second node and a drain coupled to the first output node.

12. The system of claim 11 wherein the circuit further includes a comparator having comparator input nodes coupled to the first and second output nodes and a comparator output node configured to provide the output indicative of the state of the memory cell.

13. The system of claim 11 wherein a first capacitive current component associated with the first output node has a value substantially equal to a value of a second capacitive current component associated with the second output node.

14. The system of claim 13 wherein the first capacitive current component value is dependent on a value of a parasitic capacitance of the first output node, and the second capacitive current component value is dependent on a value of a parasitic capacitance of the second output node.

15. The system of claim 11 wherein the first mirror configuration includes a first transistor, a second transistor, and a third transistor arranged in a current mirror to provide the cell current to the first node and the first output node, and wherein the second mirror configuration includes a fourth transistor, a fifth transistor, and a sixth transistor arranged in a current mirror to provide the reference current to the second node and the second output node.

16. A method, comprising:
providing a cell current derived from a memory cell to a first node of a first portion of a first mirror configuration;
providing a reference current derived from a reference cell to a first output node of a first portion of a second mirror configuration, the first node being coupled to a source of a first pass gate, the first output node being coupled to a drain of the first pass gate;
providing the reference current to a second node of a second portion of the second mirror configuration;
providing the cell current to a second output node of a second portion of the first mirror configuration, the second node being coupled to a source of a second pass gate, the second output node being coupled to a drain of the second pass gate; and
generating an output indicative of a state of the memory cell based on a first voltage at the first output node and a second voltage at the second output node.

17. The method of claim 16 wherein generating the output includes comparing the first voltage with the second voltage.

18. The method of claim 16 wherein a first capacitive current component associated with the first output node has a value substantially equal to a value of a second capacitive current component associated with the second output node.

19. The method of claim 18 wherein the first capacitive current component value is dependent on a value of a parasitic capacitance of the first output node, and the second capacitive current component value is dependent on a value of a parasitic capacitance of the second output node.

20. A circuit, comprising:
a first transistor and a second transistor forming a first part of a first mirror configuration to receive a cell current;
a third transistor including a gate coupled to gates of the first and second transistors to form a second part of the first mirror configuration to receive the cell current;
a fourth transistor and a fifth transistor forming a first part of a second mirror configuration to receive a reference current;
a sixth transistor including a gate coupled to gates of the fourth and fifth transistors to form a second part of the second mirror configuration to receive the reference current;
a first pair of transistors coupled to the second and sixth transistors at a first node and a first output node;
a second pair of transistors coupled to the third and fifth transistors at a second node and a second output node;
a first pass gate coupled between the first node and the first output node; and
a second pass gate coupled between the second node and the second output node.

21. The circuit of claim 20 further comprising a comparator that includes a first comparator input node coupled to the first output node and a second comparator input node coupled to the second output node.

22. The circuit of claim 21 further comprising a third pass gate coupled between the first and second comparator input nodes.

23. The circuit of claim 20 wherein the first pass gate includes a source coupled to the first node and a drain coupled to the first output node.

24. The circuit of claim 23 wherein the second pass gate includes a source coupled to the second node and a drain coupled to the second output node.

25. The circuit of claim 24 wherein the first and second pass gates include gate terminals coupled to a same select line.

26. The circuit of claim 20 wherein one transistor of the first pair of transistors is connected as a diode between the first node and a ground potential node.

27. The circuit of claim 26 wherein one transistor of the second pair of transistors is connected as a diode between the second node and the ground potential node.

28. The circuit of claim 20 further comprising a memory cell coupled to the first mirror configuration.

* * * * *